(12) United States Patent
O'Riordan

(10) Patent No.: US 8,214,791 B1
(45) Date of Patent: Jul. 3, 2012

(54) USER INTERFACE FOR INHERITED CONNECTIONS IN A CIRCUIT

(75) Inventor: Donald J. O'Riordan, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 345 days.

(21) Appl. No.: 12/561,999

(22) Filed: Sep. 17, 2009

(51) Int. Cl.
*G06F 17/50* (2006.01)

(52) U.S. Cl. ........ 716/139; 716/100; 716/101; 716/104; 716/119

(58) Field of Classification Search .................. 716/100, 716/101, 102, 104, 119, 139
See application file for complete search history.

(56) References Cited

U.S. PATENT DOCUMENTS

| | | | |
|---|---|---|---|
| 6,754,207 B1 * | 6/2004 | Hesse | 370/388 |
| 6,823,300 B1 * | 11/2004 | Ferreri et al. | 703/15 |
| 7,350,180 B1 * | 3/2008 | Slavin | 716/103 |
| 7,382,775 B2 * | 6/2008 | Hesse | 370/386 |
| 7,930,257 B2 * | 4/2011 | Nugent | 706/12 |
| 8,041,653 B2 * | 10/2011 | Nugent | 706/12 |

* cited by examiner

*Primary Examiner* — Sun Lin
(74) *Attorney, Agent, or Firm* — Schwegman, Lundberg & Woessner, P.A.

(57) ABSTRACT

Certain embodiments of the present invention enable a user to display and edit the effects of inherited connections in a circuit that is characterized as a hierarchical arrangement including cell instances and connectors. The hierarchical arrangement may include a tree structure where the cell instances include devices and the connectors include wires and pins. Property names are associated with connectors for identifying corresponding signal sources, and property-setting expression are associated with cell instances for specifying property-name values and making the corresponding identifications. Displays may include a path along the hierarchical arrangement from a given connector to a corresponding signal source including the effects of property names and property-setting expressions along the path. Displays may enable editing by the user to change property names and property-setting expressions along the path and view corresponding results for the inherited connections.

20 Claims, 13 Drawing Sheets

Transistor Level Implementations of NAND an NOR gates

CMOS NAND gate

CMOS NOR gate

USER INTERFACE FOR INHERITED CONNECTIONS IN A CIRCUIT

BACKGROUND OF THE INVENTION

1. Field of Invention

The present invention relates to circuit design generally and more particularly to user interfaces for circuit design.

2. Description of Related Art

Inherited Connections have been developed as a hierarchical rule-based mechanism for establishing connectivity for certain objects in circuit designs (e.g., power connectivity). Industrial standards have been developed as well as more specific software implementations. ("OpenAccess™ 2.2: The Standard API for Rapid EDA Tool Integration", David Mallis et al., Silicon Integration Initiative, Inc., Austin Tex., 2004.)

However, increasingly complex designs have made it increasingly difficult for designers to access (e.g., visualize) the details of how the design choices affect the connectivity results. Similarly, the available tools have not substantially enabled the user to change or debug this connectivity in order to improve related designs.

Thus, there is a need for improved methods and related systems that enable improved user interfaces for inherited connections in circuit designs.

SUMMARY OF THE INVENTION

Certain embodiments of the present invention enable a user to display and edit the effects of inherited connections in a circuit that is characterized as a hierarchical arrangement including cell instances and connectors. The hierarchical arrangement may include a tree structure where the cell instances include devices and the connectors include wires and pins. Property names are associated with connectors for identifying corresponding signal sources, and property-setting expressions are associated with cell instances for specifying property-name values and making the corresponding identifications. Displays may include a path along the hierarchical arrangement from a given connector to a corresponding signal source including the effects of property names and property-setting expressions along the path. Displays may enable editing by the user to change property names and property-setting expressions along the path and view corresponding results for the inherited connections.

One embodiment includes a method of providing inherited connections in circuits. A hierarchical arrangement for a circuit is specified including cell instances and connectors arranged in a tree structure that includes a top-level node at a top end of the hierarchical arrangement. The cell instances include electrical devices, and the connectors include wires and pins. One or more connectivity expressions are associated with the connectors for identifying corresponding signal sources for the connectors, where each connectivity expression includes a property name for identifying a signal source and a default value for the signal source. One or more property-setting expressions are associated with the cell instances, where each property-setting expression relates a property name to a specified connector and associates a signal source for the property name with a signal source for the specified connector. A first signal source for a first connector is associated with a first connectivity expression that includes a first property name and a first default value. This first signal source is resolved by following a path in the hierarchical arrangement from the first connector toward the top-level node and using one or more connectivity expressions and property-setting expressions along the path to determine the first signal source. Values from the path are displayed to a user including a sequence of one or more property names and corresponding property-setting expressions along the path between the first connector and the first signal source.

Note that the word first is used here and elsewhere for labeling purposes only and is not intended to denote any specific spatial or temporal ordering. Furthermore, the labeling of a first element does not imply the presence a second element.

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer.

In these ways the present invention enables improved user interfaces for inherited connections in circuit designs.

DETAILED DESCRIPTION OF EXEMPLARY EMBODIMENTS

Figure 1:
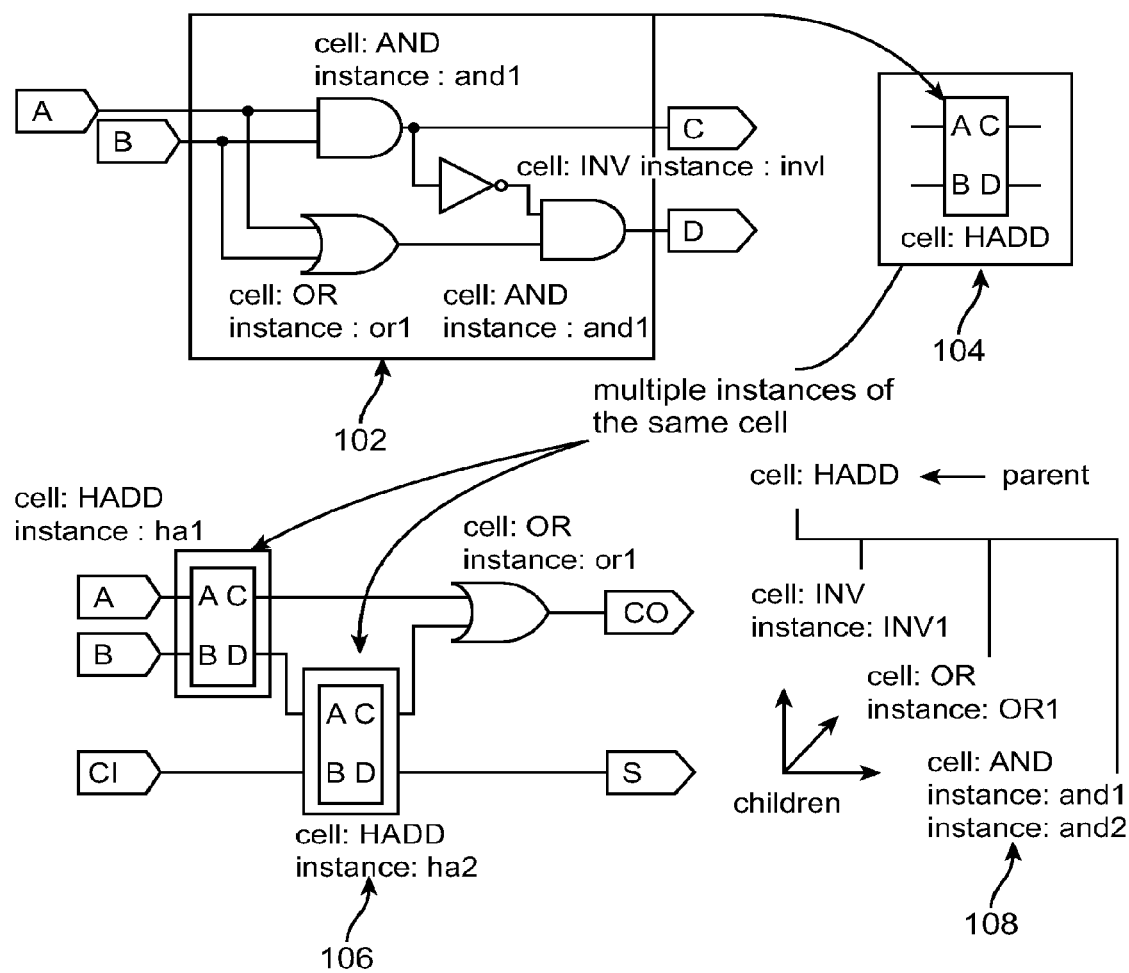
FIG. 1 shows a sequential illustration of an exemplary hierarchical schematic for a full-adder circuit that includes two half-adder circuits.

FIG. 1 shows a sequential illustration of a hierarchical schematic for a full-adder circuit that includes two half-adder circuits. A half-adder circuit (HADD) is shown with structural detail 102 and without structural detail 104. A full-adder circuit 106 is shown with structural detail that includes two half-adder circuits. A corresponding hierarchical tree 108 is also shown.

Circuit schematics are typically hierarchical, such as the illustrated full adder circuit 106. The full-adder circuit 106 is itself decomposed into a number of sub-schematics, specifically two half-adder cells (cell: HADD), and an or-gate (cell OR), connected as shown. Cell HADD itself is de-composed into a half adder circuit 102, which includes two AND gates, an OR gate, and an INV-gate. Most modern circuits are far more complicated, with many levels of hierarchy, and many instances and components.

The half adder 102 has two AND cell instances, one OR cell instance, and one INV cell instance, none of which are further decomposable (i.e. these are known as leaf-level instances). The half adder cell 102 also has four pins: A, B (inputs) and C, D (outputs). The full adder 106 contains two instances of the HADD cell, in addition to pins A, B, CI (inputs) and CO, S (outputs) and various (unnamed) connecting wires. A multiplier circuit for example may consistent of a matrix of hundreds of such full adders. A CPU (Central Processing Unit) circuit for a computer may consist of a number of multiplier circuits, in addition to other complex circuitry which can be themselves hierarchically composed.

It is also commonplace for a designer creating a large and complex circuit (such as a microprocessor) to obtain some components from external IP (Intellectual Property) sources, and other components from internal IP sources, in addition to perhaps developing some components of his own. All such components may again by hierarchically composed.

Any given schematic block (or cell) may itself contain some sub-instances (of other cells), which may be any combination of leaf-level cells, non-leaf level cells, which can be further decomposed, pins, which are typically used as connection points for the next level up in the hierarchy, and wires (or nets). For example, the half adder 102 has some pins A, B, C, D which are used as connection points as shown in the two half adder instances in the full adder 104. The corresponding hierarchical tree 108 shows a top-level node (or parent node) for the half-adder 102 with children that include one instance of an INV-gate, one instance of an OR-gate, and two instances of an AND-gate.

Figure 2:
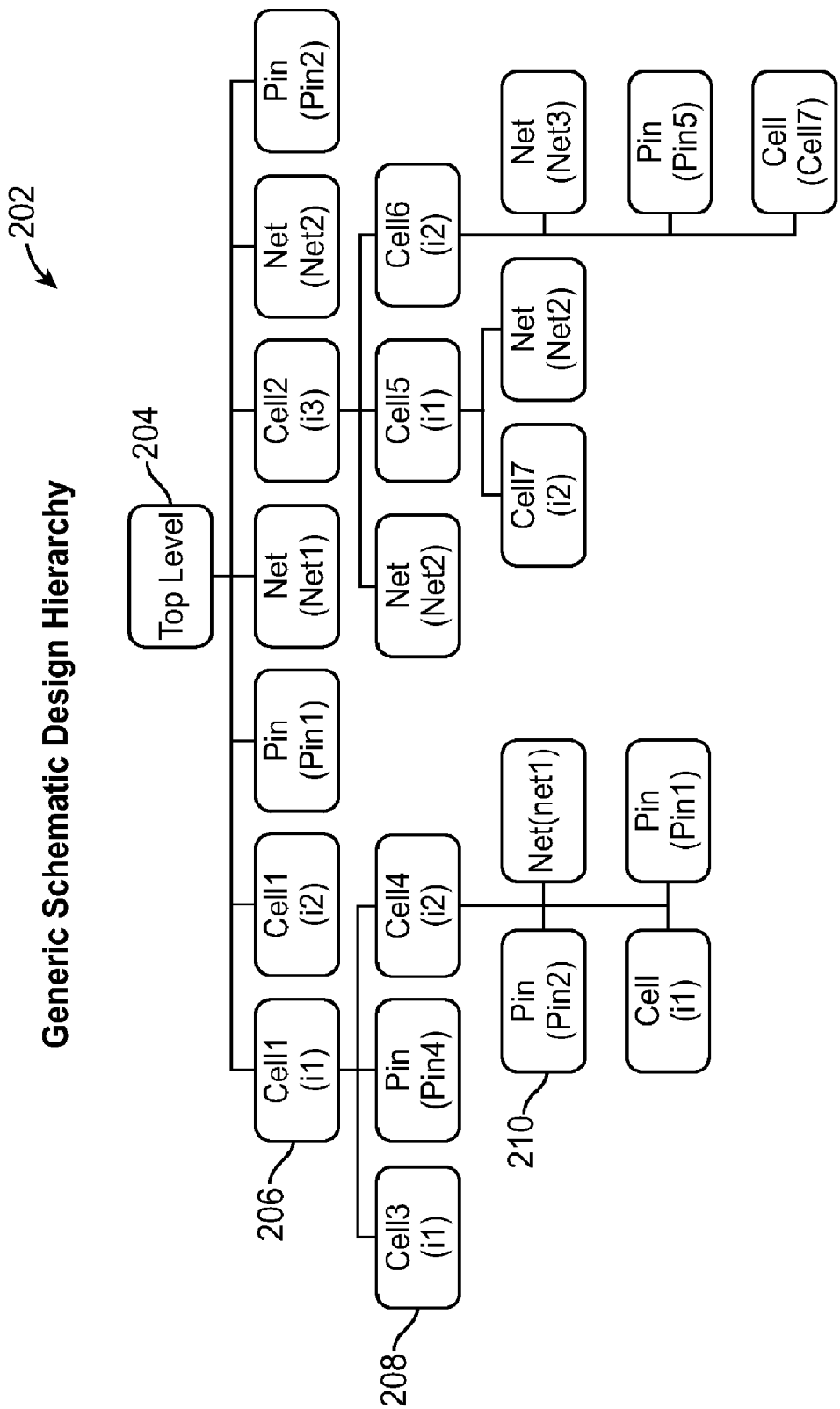
FIG. 2 shows an exemplary generic schematic design hierarchy for a schematic.

FIG. 2 shows a generic schematic design hierarchy 202 including a top-level cell (or node) 204, a first level 206, a second level 208, and a third level 210 (in this case the lowest level). For example, the first level 206 includes instances i1, i2, and i3 of type Cell1, instances Pin1 and Pin2 of type Pin, and instances Net1 and Net2 of type Net. In general, a schematic cell has a somewhat recursive definition in that it can consist of instances of zero or more leaf-level cells, zero or more non-leaf level cells, zero or more nets (or wires), and zero or more pins. In this context, leaf-level cells are those with no further recursive definition. Each further recursion from a non-leaf cell is indicated in FIG. 2 by a vertical line below the cell (e.g., as instance i1 in the first level 206). Typically, all but leaf-level cells will contain multiple pins and nets and non-leaf instances of other cells With reference to FIG. 1, the full adder circuit 106 includes two half-adder (HADD) instances. The first instance is named 'ha1', and the second instance is named 'ha2'. Pins A and B of the ha1 instance of cell HADD connect to full adder pins A and B. Pin C of ha1 connects to the input of instance 'or1' (of cell OR). If the connecting wire is not explicitly named as in this example, it can be assigned an implicit name. The pin D of instance 'ha1' of the first half-adder is connected to the input pin A of the second half-adder instance 'ha2'. The input pin B of the second half adder instance 'ha2' is connected to the CI pin of the full adder, while the output pin D of the same instance 'ha2' is connected to pin S of the full adder cell. Such connections are explicitly drawn by schematically connecting wires from pins or instances to other pins or instances, or by drawing wire-stubs (i.e., non-continuous wires), where each end of the wire stub is explicitly named. Such conventions are common to those skilled in the state of the art.

Figure 3:
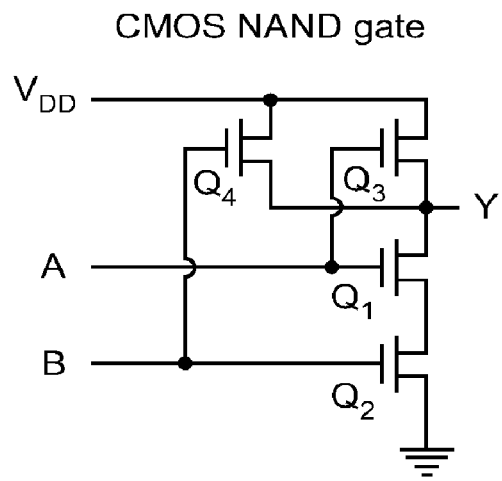
FIG. 3 shows exemplary sub-schematics for a NAND gate and a NOR gate.
Figure 3:
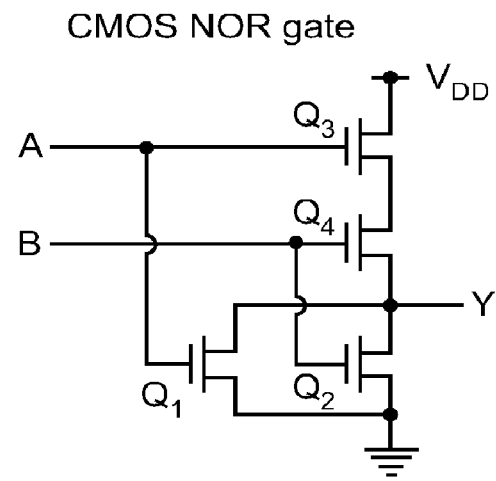

The individual logic components such as NOR gates, NAND gates, OR gates etc. are eventually realized via the manufacturing of connected transistor level devices. FIG. 3 shows exemplary sub-schematics for a NAND gate 302 and a NOR gate 304. Note that unlike the logic circuits considered thus far, the transistor level implementation includes additional pins. In particular, they contain power pins such as the implicit ground pin and the named '$V_{DD}$' pin shown for either gate. When it comes to physically implementing circuits such as the full adder 106 or a more complex example, it is typically necessary to also connect up these power pins which generally exist for most (or all) leaf-level cells. However, in many complex circuit designs these power pins are often omitted in circuit schematics to avoid details that are unnecessary for the pure logic. A large hierarchical design will often contain instances of different types of sub-designs, and each such sub-design may have very different power requirements than the others. Examples may include high-voltage circuits operating off 3 volt supplies, low speed logic circuitry operating off 1.0 volt supplies, high-speed logic circuitry operating off 1.2 volt supplies, etc. This power differentiation has led to the introduction of the concept of power domains, in which relevant signals have independent power sources.

Technologies for multiple power domains and related "voltage islands" have led to the development of inherited connections for managing power connectivity. Inherited connections have enabled improved characterizations of power connectivity including complications of multiple power domains and power routing, so that explicit power routing (via explicit connections of pins to wires aka nets and wire stubs) can be minimized. ("OpenAccess™ 2.2: The Standard API for Rapid EDA Tool Integration", David Mallis et al., Silicon Integration Initiative, Inc., Austin Tex., 2004.)

Conceptually, inherited connections allow for power connectivity to be specified via a rule-based scheme, as opposed to an explicit connection model. For example, any net or pin object can be declared as 'eligible' for connection via this rule-based scheme by assigning it a particular property known as a 'net expression'. The net expression itself has two parts, one part known as a property name, and the second being a default connection point (typically a global net). Then net/pin objects near the leaf-levels (or intermediate levels) of a vast design hierarchy can have their power connectivity programmed via a search/rule look-up scheme.

Inherited connections have particular relevance in the context of IP integration. Large systems-on-chip typically comprise many blocks, not all of which are authored by the same source. Indeed, it is common place to integrate design IP sources which have been obtained from different vendors or design sites in addition to the company doing the top level design itself. Each piece of IP may employ the inherited connection scheme to declare its power intent, however there is no guarantee of consistency in the property naming. One piece of IP may define a property called 'PWR' to denote its power pin connectivity, while another may define a property called 'POWER' for the same meaning, with a third using '$V_{DD}$'.

In order to deal with these situations, inherited connections schemes were extended to include the concept of 're-parameterization' such that at any level of the design, the inherited connection property names used by the lower levels of the design hierarchy could be re-parameterized to a new name. For example, a designer integrating the three pieces of IP considered above may decide to standardize on "$AV_{DD}$" for the power property name used for his portions of the design (which contain the IP sources among other blocks). This scheme allows for unification of power connectivity property lookups as IP sources are integrated and combined.

Figure 4:
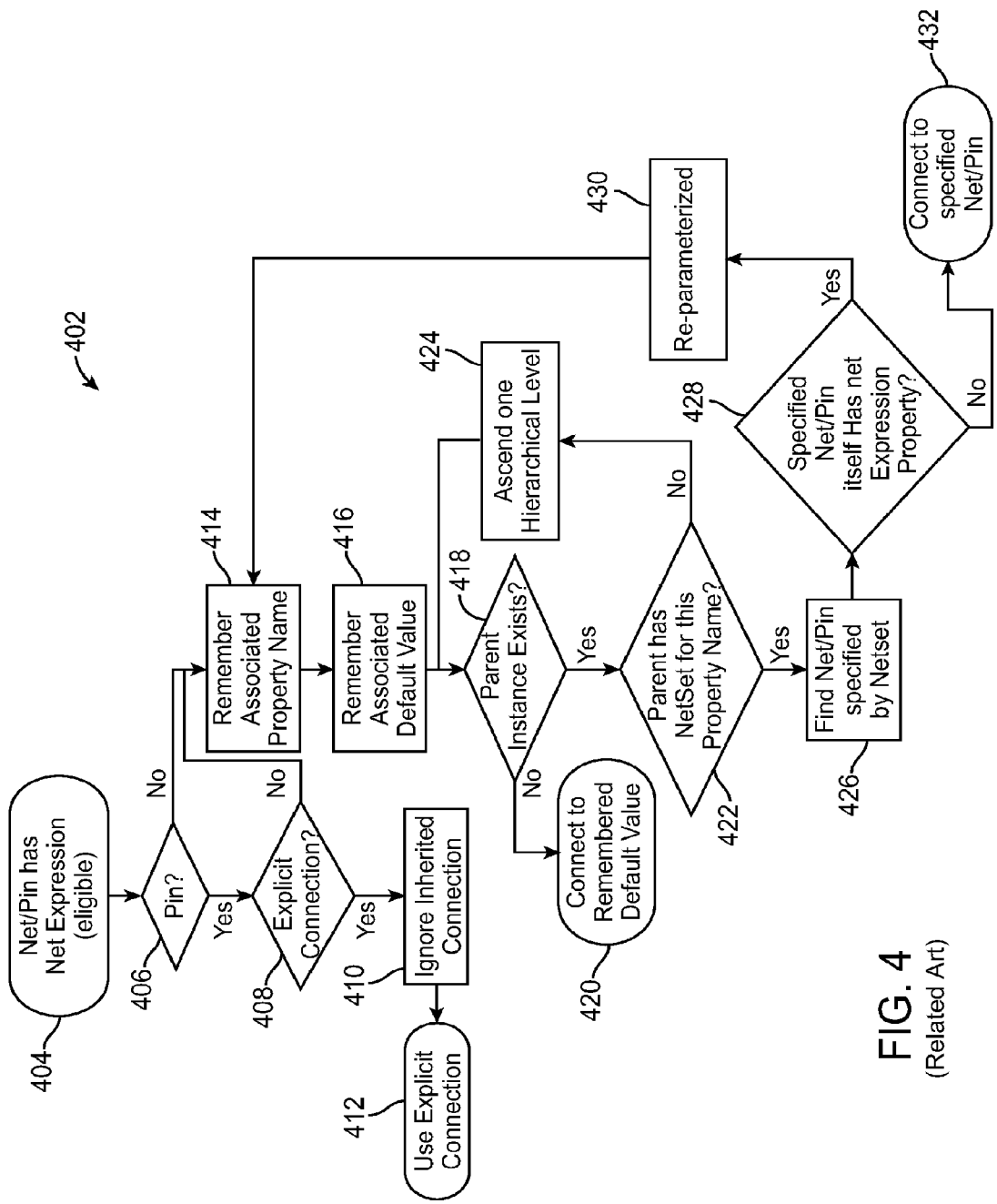
FIG. 4 shows an exemplary method for resolving an inherited connection for a hierarchical arrangement of a circuit.

FIG. 4 shows an exemplary method 402 for resolving an inherited connection for a hierarchical arrangement of a circuit (e.g, FIG. 2). In this context, there are several distinct elements in the scheme including pins, wires (or nets), net expressions, and netSet properties. Pins and wires may be declared eligible for connection via the inherited connection scheme by assigning them a 'net expression.' A net expression includes two parts, one part known as a property name, and the second being a default connection point or signal source (typically a global net). Searching begins at the bottom of the hierarchy (e.g., elements of the lowest level 210 of the hierarchical tree 202) and works its way up (e.g., toward the top level 204), looking for a special property (called a 'netSet' property) on any cell instance in the ancestry or design hierarchy in which the candidate net/pin exists. The netSet property attempts to 'resolve' the connectivity by specifying a property name/signal name pair. Any object lower in the hierarchy for which a search has begun will be connected to the specified signal (usually a net or pin itself). In addition to resolving the connectivity by mapping a property name to signal name, the netSet may effect a re-parameterization by mapping the given property name to a new property name (e.g., as in the above discussion on IP integration).

The method 402 can be followed for each individual net/pin occurrence (or object) with an associated net expression property 404. If a given object that has a net expression is a pin object 406, the method first checks to see if the pin is explicitly connected 408. If so, then the explicit connection (via drawn wire or named wire stub) will 'override' the inherited connection properties; that is, the inherited connection will be ignored 410 and the explicit connection will be honored 412. However, if the pin is not explicitly connected, then the method will remember both the property name 414 and the default value 416 specified in the net expression Likewise, for any net (aka wire) object with a net expression property, the same happens and the net expression property name 414 and default value 416 will be remembered.

A search up the hierarchy now begins, where the parent instance (e.g., the cell instance that contains the net/pin object under consideration) is determined 418. If no such instance exists, then the net/pin object under consideration is connected to the remembered default value 420. If such an instance is found to exist, and that instance does not contain a netSet property that matches the property name being searched for 422, then the search continues one level up in the hierarchy 424. If such an instance is found to exist and that instance does contain a netSet property that matches the property name being searched for 422, then the net/pin specified by the netSet is determined 426. If this specified net/pin itself has its own net expression property 428, then the net/pin object under consideration is re-parameterized by the net expression property of the specified net/pin 430. That is, the net/pin object under consideration inherits the net expression of the specified net/pin so that the corresponding new property name and default are remembered and the search continues for the new property. If this specified net/pin does not have its own net expression property 428 (e.g., represents a top-level signal source), then the net/pin object under consideration is connected to the specified net/pin and its corresponding signal source 432.

In general, the search upward continues 424 for each failed ancestor instance (i.e., each cell instance in the ancestry that does not contain a netSet property corresponding to the search property), until either a match is found, or the top of the design hierarchy is reached so that no parent exist 418. In this latter case, the last remembered default value is applied and the net/pin under consideration is connected to that default 420.

Note that the method 402 allows for multiple re-parameterizations 430 at multiple levels of the design, as will often be the case when IP consists of sub-IP consists of sub-sub-IP, and at each state the IP integrator attempts to resolve the various property names by re-parameterizing to a new search based on a unified name.

Connections via the defaulting mechanism 420 are generally considered undesirable as they can lead to inadvertent power domain short circuits. It is preferred practice to have all inherited connections resolved via an explicit matching netSet at some point in the hierarchy, as the presence of that netSet indicates that the user/integrator has taken the explicit thoughtful decision steps to resolve the connectivity. However, when designs are large and complex, with many levels of hierarchy, when multiple IP sources and IP cells or sub-designs are involved, and when multiple power domains are involved, this entire connectivity-via-rules process can become difficult to manage so that all connectivity issues are properly resolved. Mistakes (e.g., incorrect connectivity) and omissions (e.g., missing 'netSets' leading to power domain short circuits) can be extremely costly leading to failed circuits.

Figure 5:
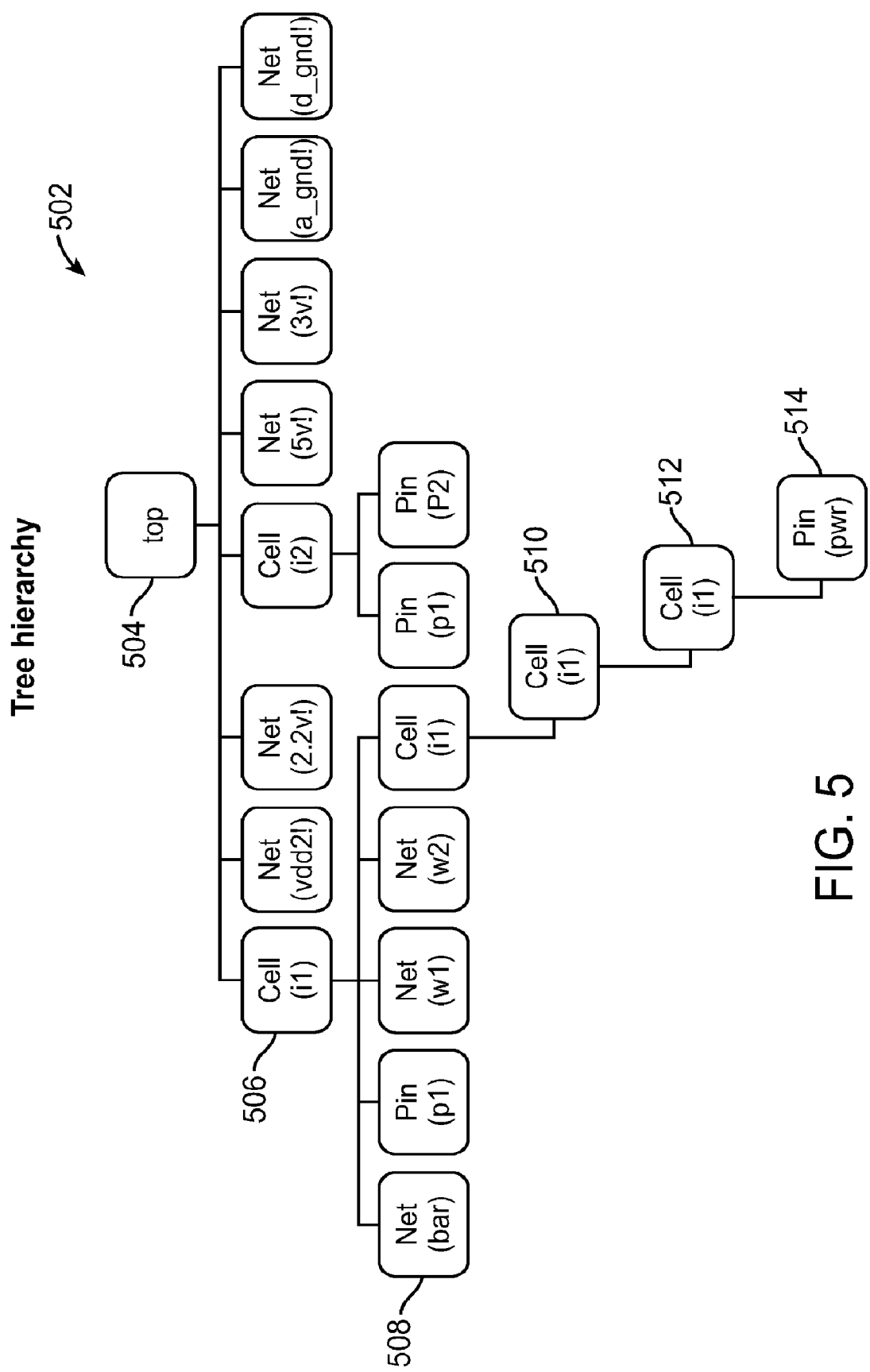
FIG. 5 shows an exemplary tree hierarchy for a circuit schematic for an embodiment of the present invention.

Certain embodiments of the present invention enable a user (e.g., circuit designer/IP integrator) to understand the resolved power connectivity and to debug mistakes and omissions. FIG. 5 shows an exemplary tree hierarchy 502 (or hierarchical arrangement) for an embodiment of the present invention. Similarly as in FIG. 2, the tree hierarchy 502 includes a top-level cell (or node) 504, a first level 506, a second level 508, a third level 510, a fourth level 512, and a fifth level 514 (in this case the lowest level). In this case, the third fourth and fifth levels are shown as single-element levels for simplicity. The fifth level 514 includes a Pin named "pwr" that is connected to the Top 504 through cell instances (labeled "i1") at the first, second, third, and fourth levels. Note that some connectors are identified by their connections to top-level signal sources indicated by a bang symbol ("!"). For example, the Nets in the first level 506 are all connected top-level signal sources.

Figure 6:
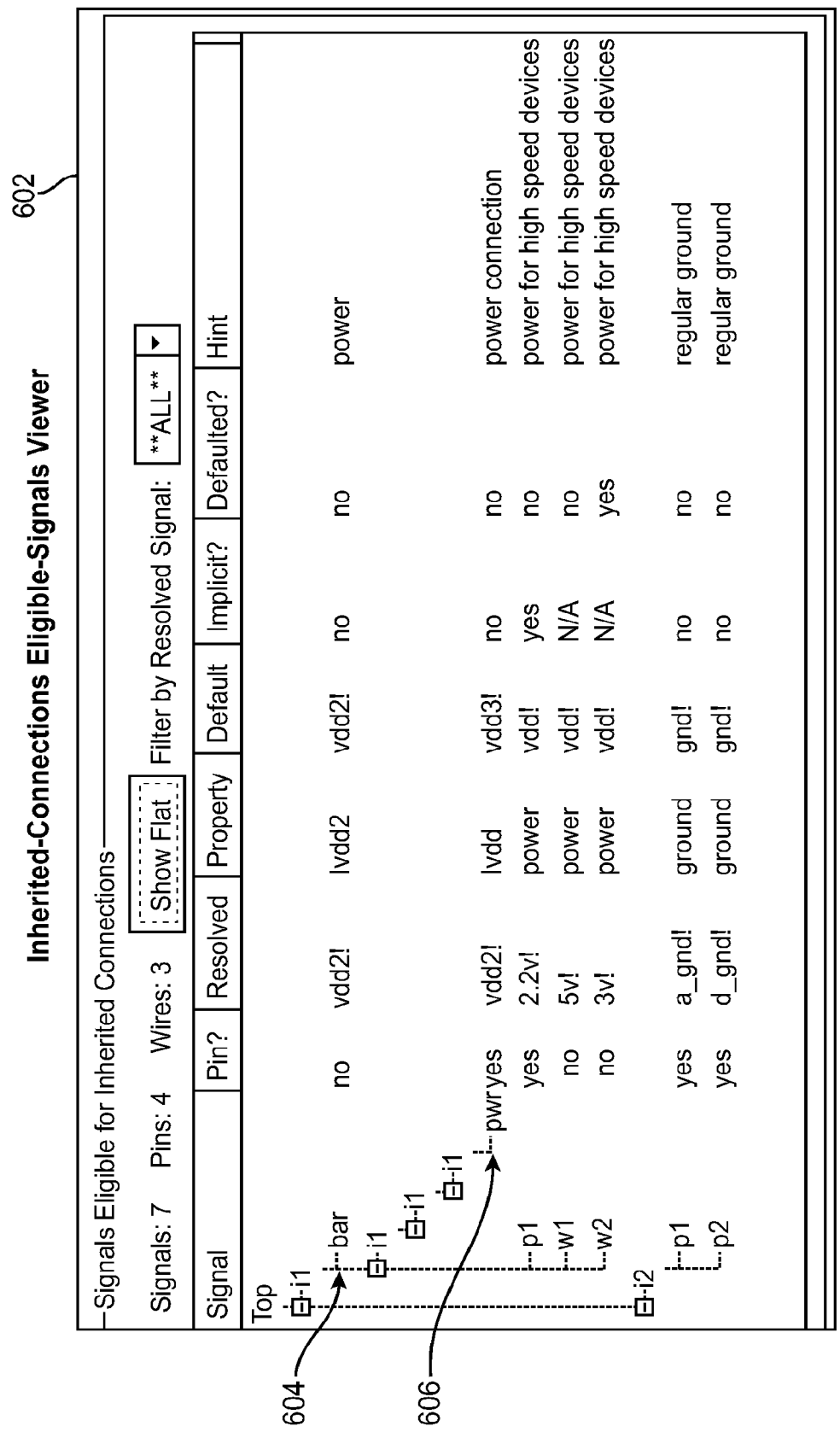
FIG. 6 shows an inherited-connections eligible-signals viewer for an embodiment of the present invention.

FIG. 6 shows an inherited-connections eligible-signals viewer 602 according to an embodiment of the present invention with reference to the tree hierarchy 502 of FIG. 5. The eligible-signals viewer 602 indicates that the design corresponding to the tree hierarchy includes seven (7) signals, including four (4) pins and three (3) wires. Optionally the signal display (first column) can be made "flat" rather than hierarchical so that the complete path is shown on a line (e.g., "top/i1/i1/i1/i1/pwr" for the "pwr" pin on the fifth level 514). In this case "ALL" signals are shown although a restriction to a limited signal set can be made.

The first column of the eligible-signals viewer 602 is labeled "Signal" and shows wires and pins (or more precisely instances of wires and pins) from the tree hierarchy 502. The second column, labeled "Pin?", indicates whether the entry is for a pin or a wire/net. The third column, labeled "Resolved", shows how the signal was resolved. In this case, all signals were resolved with top-level signals as indicated by the bang symbol ("!"). The fourth column, labeled "Property", shows the property name associated with the connector (i.e., wire or pin). The fifth column, labeled "Default", shows the default value for the property. The sixth column, labeled "Implicit?", shows whether the property associated with the connector was implicitly defined by a connection-based rule (e.g., inherited from a wire to a connected pin) or explicitly defined by the user (e.g., designer). The seventh column, labeled "Defaulted?", shows whether the default value for the property name was used. The eighth column, labeled "Hint", shows text reminder related to the resolved signal. For example, according to the second row 606 the pin "pwr", which corresponds to a "powr connection", was associated with property "lvdd" and resolved as "vdd2!", which corresponds to a top-level signal source. According to the first row 604, the wire "bar", which corresponds to "power", was associated with property "lvdd2" and also resolved as "vdd2!". This example is discussed in further detail below with reference to FIG. 8.

Figure 7:
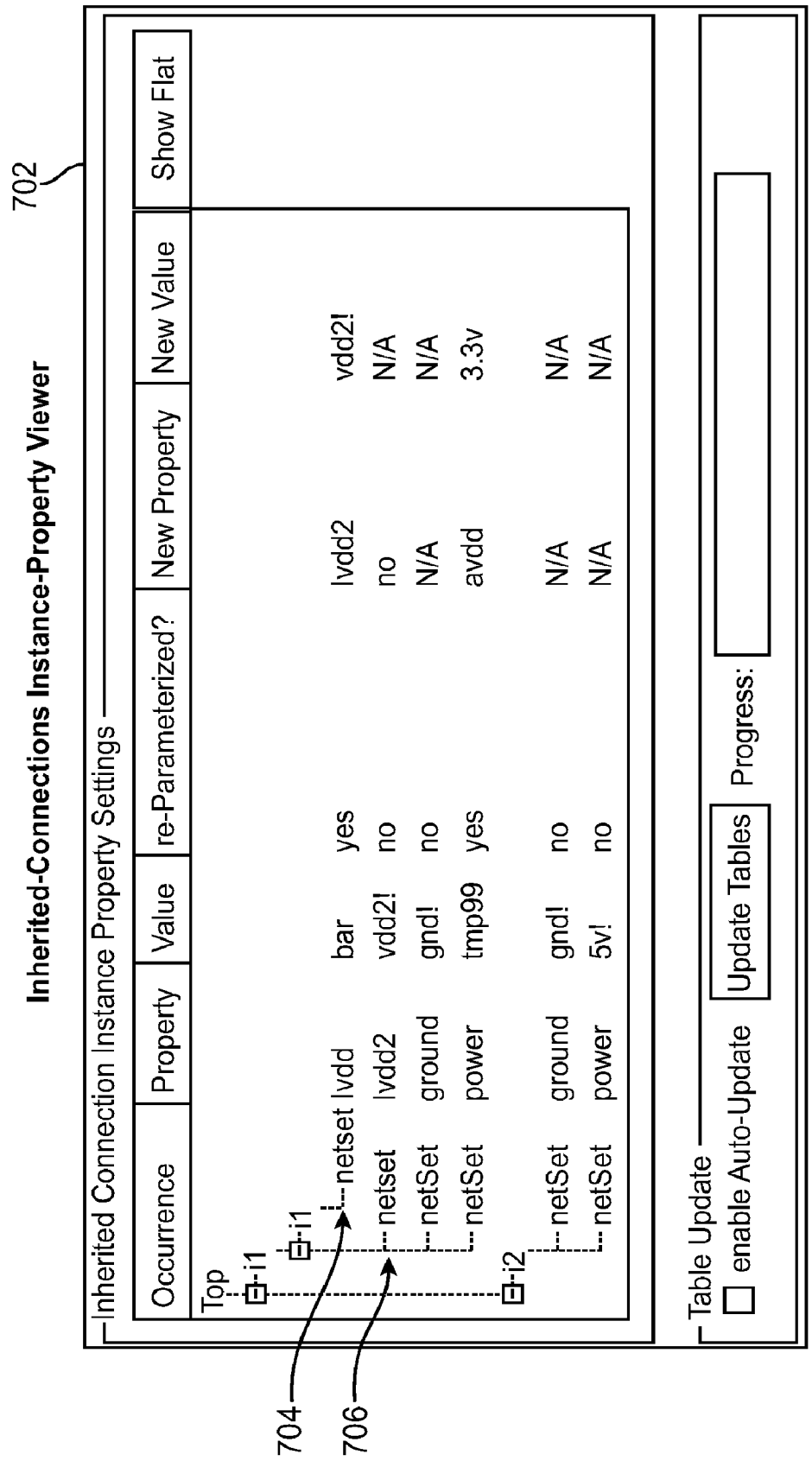
FIG. 7 shows an inherited-connections instance-property viewer for an embodiment of the present invention.

FIG. 7 shows an inherited-connections instance-property viewer 702 according to an embodiment of the present invention with reference again to the tree hierarchy 502 of FIG. 5. The first column of the instance-property viewer 702 is labeled "Occurrence" and shows where netSet expressions (e.g., property-setting expressions) occur on cell instances of the tree hierarchy 502. The second column, labeled "Property", shows the property name associated with the netSet expression. The third column, labeled "Value", shows the value assigned to the property by the netSet expression. In this column note that "bar" is a net on the second level 508 of the tree hierarchy 502, and values that include the bang symbol ("!") correspond to top-level signal sources. The fourth column, labeled "re-Parameterized?", shows whether the netSet expression led to a re-parameterization of the given property, and the corresponding "New Property" and "New Value" are shown in columns five and six respectively. For example, in the first row 704 the netSet that relates property "lvdd" to value "bar" results in a re-parameterization of property "lvdd" to property "lvdd2", which has a value "vdd2!" as shown. The second row 706 includes the netSet expression that relates property "lvdd" to value "vdd2!", which corresponds to a top-level signal source. This example is discussed in further detail below with reference to FIG. 8.

In some operational settings, the eligible-signals viewer 602 and the instance-property view 702 can be part of a combined inherited-connections browser/debugger. As shown in FIGS. 6 and 7, each of these viewers is ordered by its first column but could be ordered by any column (e.g., by a user selection of the column heading). Although these viewers provide access to the property associations for connectors and their corresponding resolved values (e.g., FIG. 6) and the property relationships corresponding to the netSet expressions (e.g., FIG. 7), the user does not have immediate access to the process by which the netSet expressions lead to the resolved value so as to facilitate debugging operations in the design. For example, as discussed above the pin "pwr" has been resolved as "vdd2!" but the underlying process is not immediately apparent.

Figure 8:
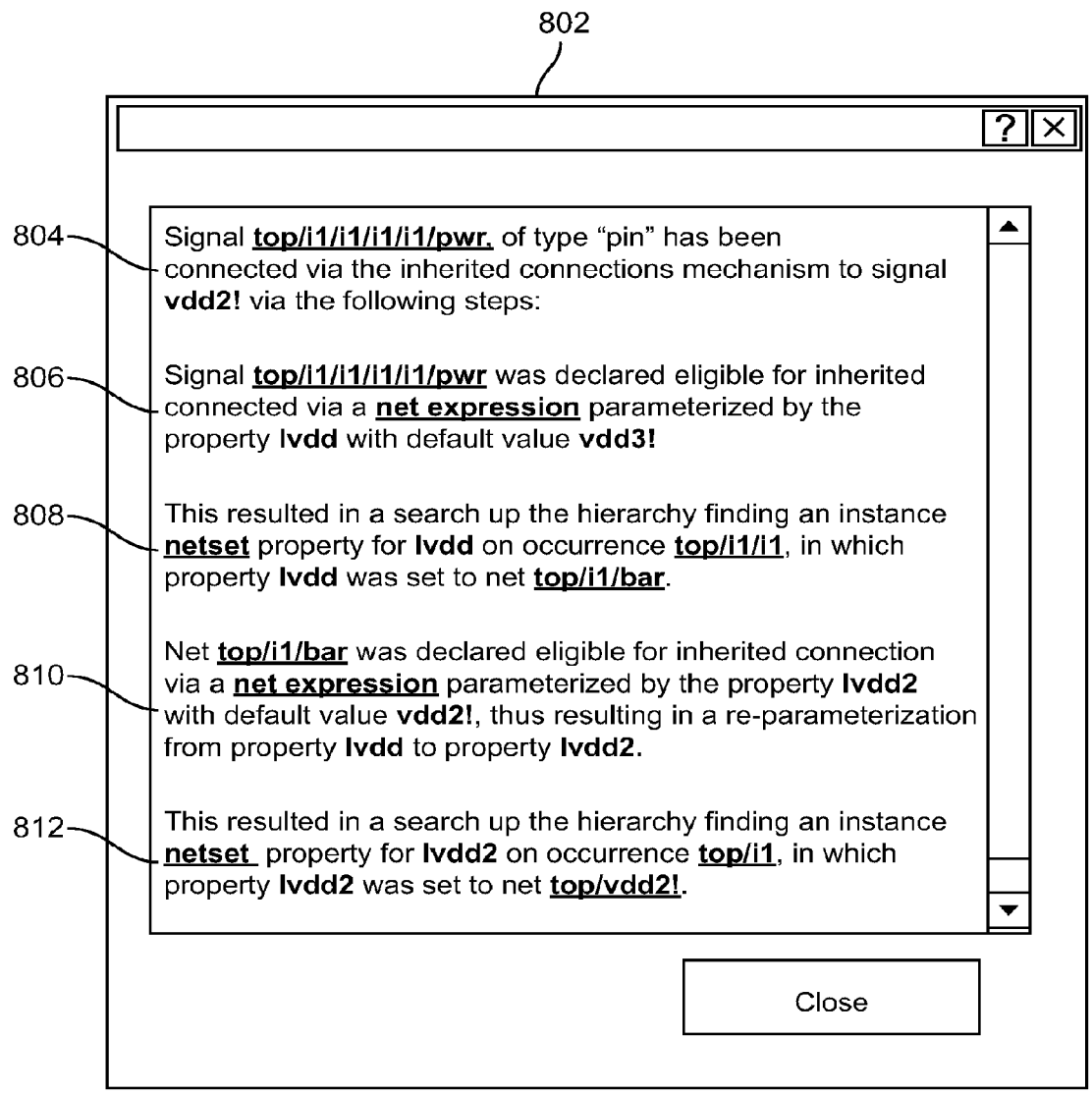
FIG. 8 shows an inherited-connections resolution viewer for an embodiment of the present invention.
Figure 9:
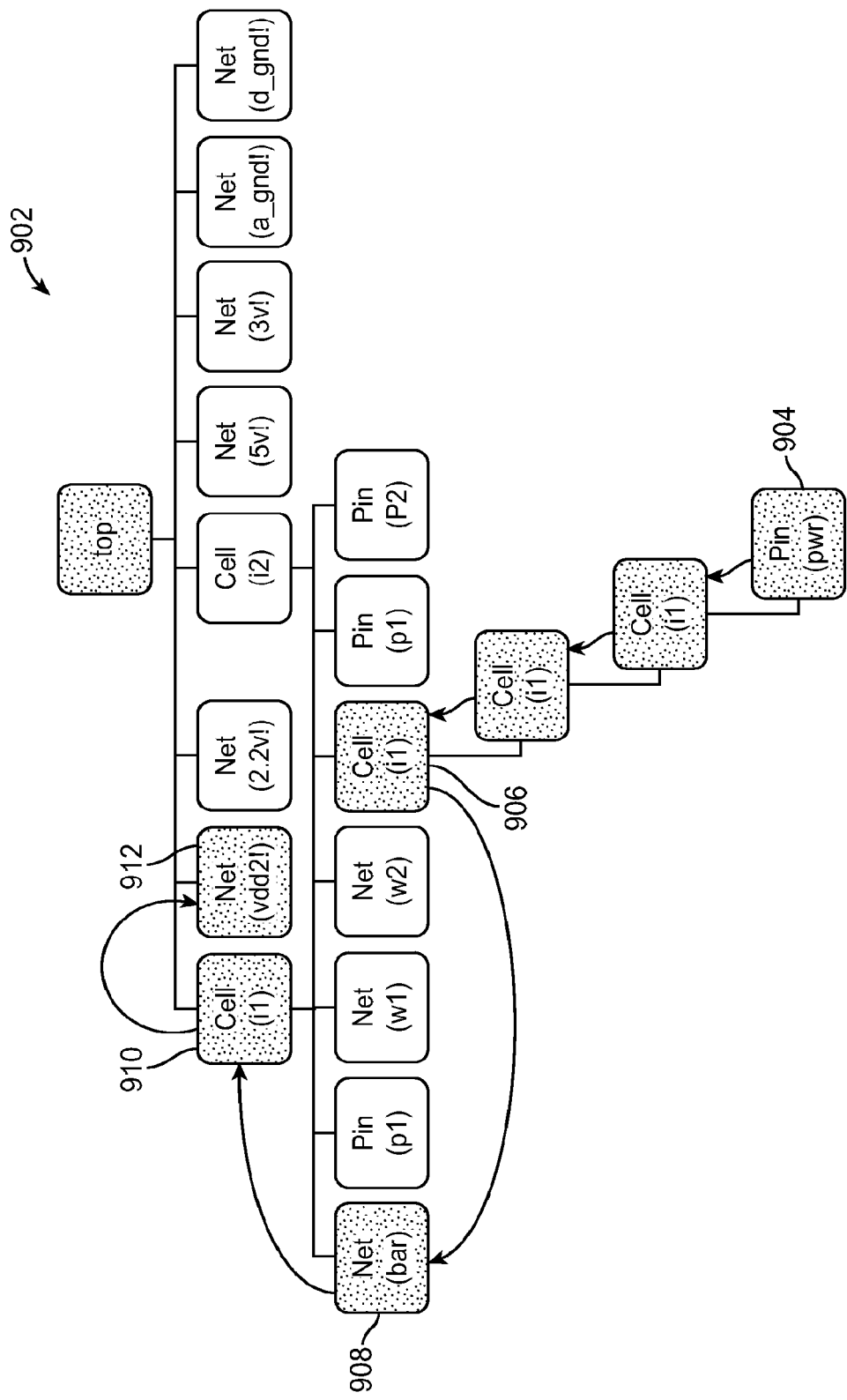
FIG. 9 shows the exemplary tree hierarchy of FIG. 5 with additional detail for an embodiment of the present invention.

FIG. 8 shows an inherited-connections resolution viewer 802 according to an embodiment of the present invention with reference to the tree hierarchy 902 of FIG. 9, where the tree hierarchy 502 of FIG. 5 has been further highlighted to show the resolution process for the "pwr" pin. This viewer 802 could be accessed, for example, by a right mouse-click on the resolved value "vdd2!" for "pwr" pin in the second row 606 of FIG. 6 as the user desires a greater explanation for this resolution.

The first entry 804 of the viewer 802 summarizes this resolution, which is further explicated in the subsequent entries. The next entry 806 shows that the "pwr" pin 904 is eligible for an inherited connection via a net expression parameterized by property "lvdd" with a default value "vdd3!", as also shown on the second line 606 of the eligible-signals viewer 602. The next entry 808 shows that this inherited connection resulted in a search up the hierarchy (as indicated by arrows alongside the tree in FIG. 9) to find an instance of netSet property for "lvdd" on an occurrence "i1" 906 in which the property "lvdd" was set to the net "bar" 908, as also shown on the first line of the instance-browser viewer 702. The next entry 810 shows that the net "bar" 908 was declared eligible for an inherited connection parameterized by the property "lvdd2" with default value "vdd2!", as also shown on the first line 604 of the eligible-signals viewer 602. The next entry 812 shows that this inherited connection resulted in a search up the hierarchy to find an instance of netSet property for "lvdd2" on an occurrence "i1" 910 in which the property "lvdd2" was set to the net "vdd2!" 908, as also shown on the first line of the instance-browser viewer 702. (Note that in the above description the hierarchical names have been abbreviated, e.g., as in "pwr" pin 904.)

Note that additional right mouse-click menu options can be added to the eligible-signals menu 602 according to the requirements of the operational setting. For example the user could use a right mouse-click on an entry in the property column to change a property associated with a connector (e.g., by selecting from a list). Likewise, a user could use a right mouse-click on an entry in the signal column to access the corresponding portion of the schematic (e.g., as in a zoom-to-net operation).

Figure 10:
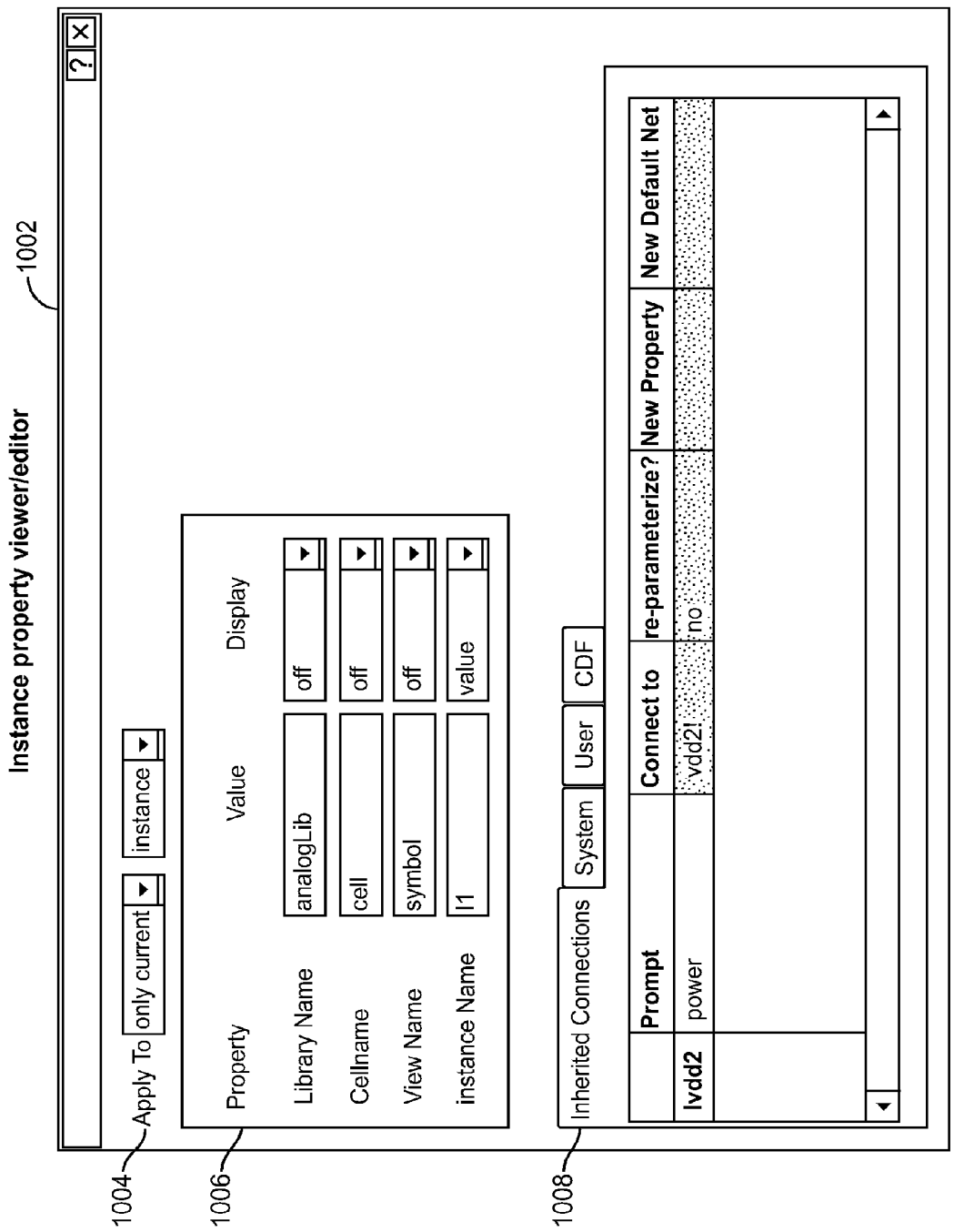
FIG. 10 shows an shows an instance-property viewer/editor for an embodiment of the present invention.

In cases where the resolution viewer 802 suggests a problem with a netSet assignment, a user may desire a specific correction or at least a debugging procedure to correct the problem. FIG. 10 shows an instance-property viewer/editor 1002 that can be accessed for a cell instance in the tree hierarchy 502, for example, by using a right mouse-click on an entry in the occurrence column or value column of the instance-property viewer 702. This viewer/editor 1002 can be used to change the assignment of a netSet property with a cell instance and to change the value assigned by the netSet property.

As shown in the viewer/editor 1002, the properties can be directed to the current instance 1004 (or alternatively multiple instances). Property information 1006 is shown. In this embodiment, the menu tab is shown for inherited connections 1008. Other tabs (e.g., System, User, CDF (Component Description Information)) can be used for additional menu options associated with the instance. The left-hand index shows the netSet property ("lvdd2") associated with the given instance ("i1"). Columns are shown for "Prompt" to show a helpful prompt and "Connect to" to show the assigned value for the netSet property. This assigned value can be edited (e.g., from a list). Additionally, a column is shown for "re-parameterize?" to enable a re-parameterization that replaces the given property with a new property and default value as shown in the last two columns. In this way the viewer/editor enables changes in netSet properties associated with a given instance. Although a single netSet property is shown in the viewer/editor 1002, additional netSet properties can also be associated with a given instance.

Figure 11:
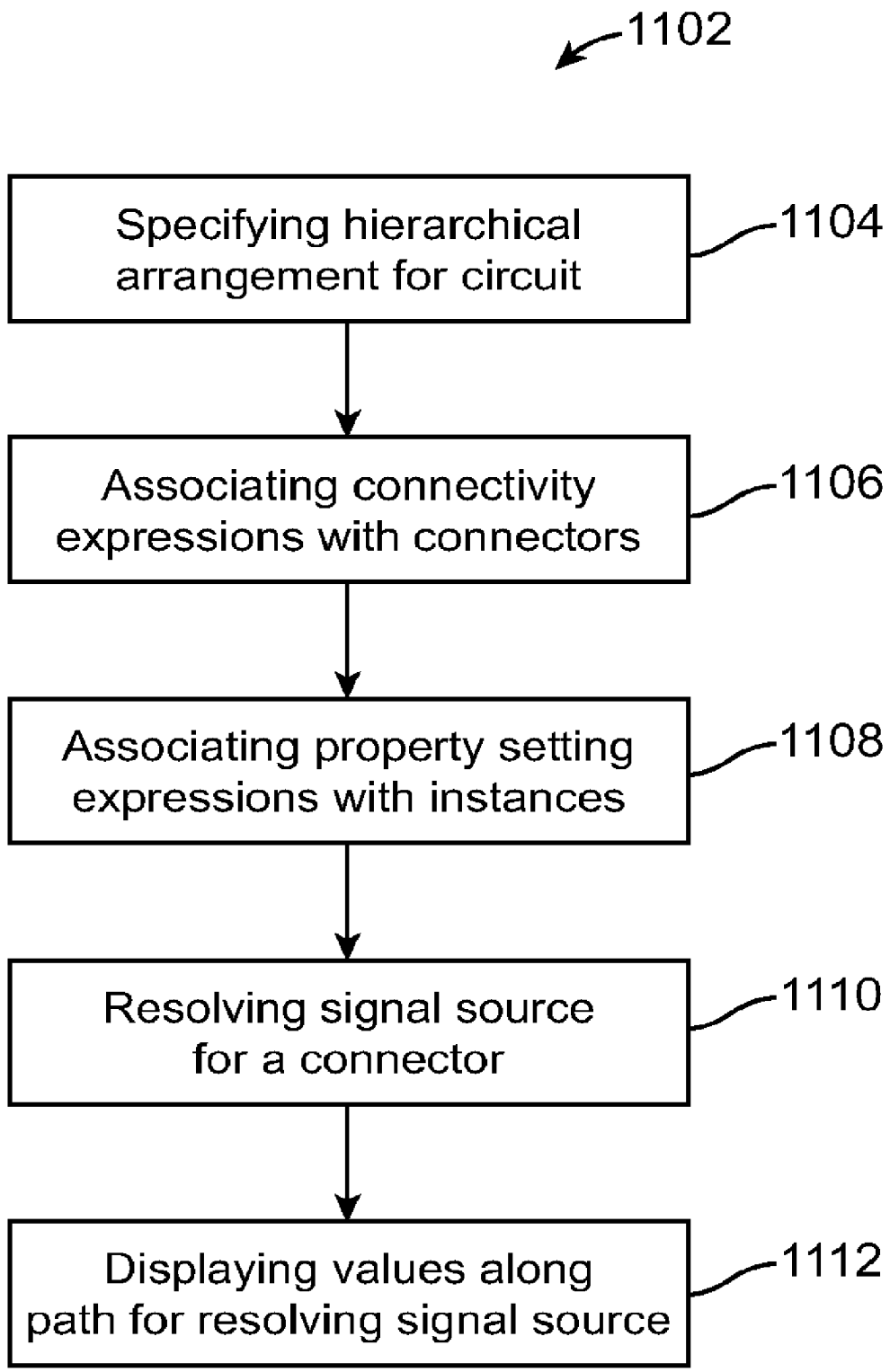
FIG. 11 shows a method of providing inherited connections in circuits for an embodiment of the present invention.

Although the above-described embodiments have been presented with reference to net expressions and netSet properties, embodiments are not restricted to this nomenclature. An embodiment of the present invention is shown in FIG. 11. A method 1102 of providing inherited connections in circuits includes: specifying a hierarchical arrangement for a circuit 1104 including cell instances and connectors arranged in a tree structure that includes a top-level node at a top end of the hierarchical arrangement (e.g., as in FIG. 9). Typically the cell instances include electrical devices, and the cell connectors include wires (also known as nets) and pins.

The method 1104 includes associating connectivity expressions with the connectors 1106 and associating property-setting expressions with the instances 1108. In this context, connectivity expressions and property-setting expressions are generalizations of the implementation-specific terms net expression and netSet property (e.g., as in FIG. 4). A connectivity expression includes a property name for identifying a signal source and a default value for the signal source, and property-setting expressions relates a property name to a specified connector (e.g., a mapping from property names to connectors).

The method 1104 includes resolving a signal source for a connector 1110 (e.g., as in FIG. 4) and displaying values on the path for resolving the signal source 1112. Typically signal sources are resolved for all connectors in the circuit, and the user selectively displays values corresponding to the path for a selected connector. As discussed below, displaying path values for resolving signal sources can be extended to enable user input for changing the resolved values for a given connector (e.g., to a different signal source).

At least some values for the results of the method can be output to a user or saved for subsequent use. For example the displayed values can be saved directly for application as in circuit design. Alternatively, some derivative or summary form of the results (e.g., averages, interpolations, etc.) can be saved for later use according to the requirements of the operational setting.

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., keyboard, display, disk drive, Internet connection, etc.). However, the computer may include circuitry or other specialized hardware for carrying out some or all aspects of the method. In some operational settings, the apparatus or computer may be configured as a system that includes one or more units, each of which is configured to carry out some aspects of the method either in software, in hardware or in some combination thereof. For example, the system may be configured as part of a computer network that includes the Internet. At least some values for the results of the method can be saved for later use in a computer-readable medium, including memory units (e.g., RAM (Random Access Memory), ROM (Read Only Memory)) and storage devices (e.g., hard-disk systems, optical storage systems).

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII). In some contexts, a computer-readable medium may be alternatively described as a computer-useable medium, a computer-storage medium, or a computer-program medium. Depending on the on the operational setting, specified values for the above-described methods may correspond to input files for the computer program or computer.

Figure 12:
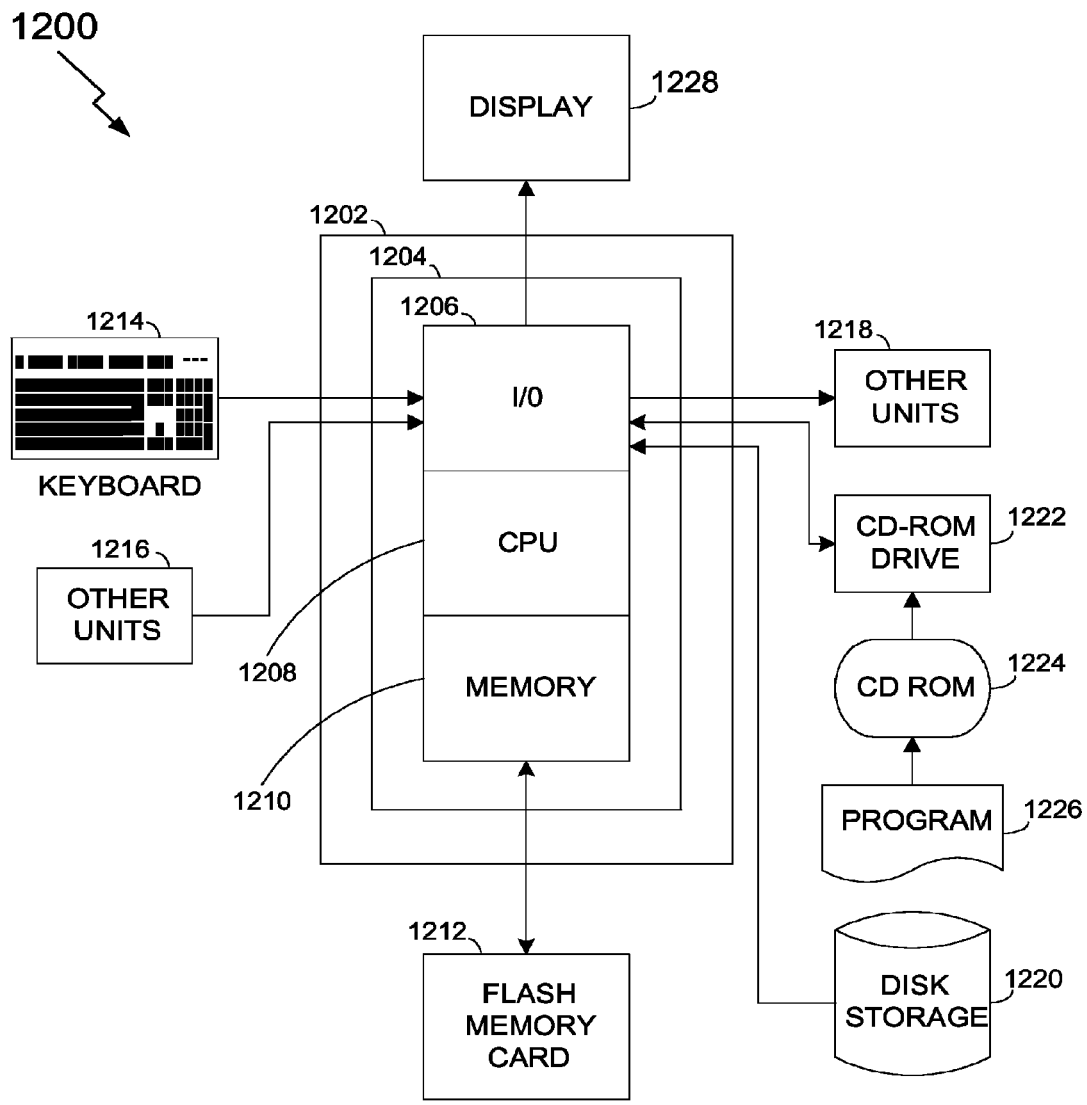
FIG. 12 shows a conventional general-purpose computer.

As described above, certain embodiments of the present invention can be implemented using standard computers and networks including the Internet. FIG. 12 shows a conventional general purpose computer 1200 with a number of standard components. The main system 1202 includes a motherboard 1204 having an input/output (I/O) section 1206, one or more central processing units (CPU) 1208, and a memory section 1210, which may have a flash memory card 1212 related to it. The I/O section 1206 is connected to a display 1228, a keyboard 1214, other similar general-purpose computer units 1216, 1218, a disk storage unit 1220 and a CD-ROM drive unit 1222. The CD-ROM drive unit 1222 can read a CD-ROM medium 1224 which typically contains programs 1226 and other data.

Figure 13:
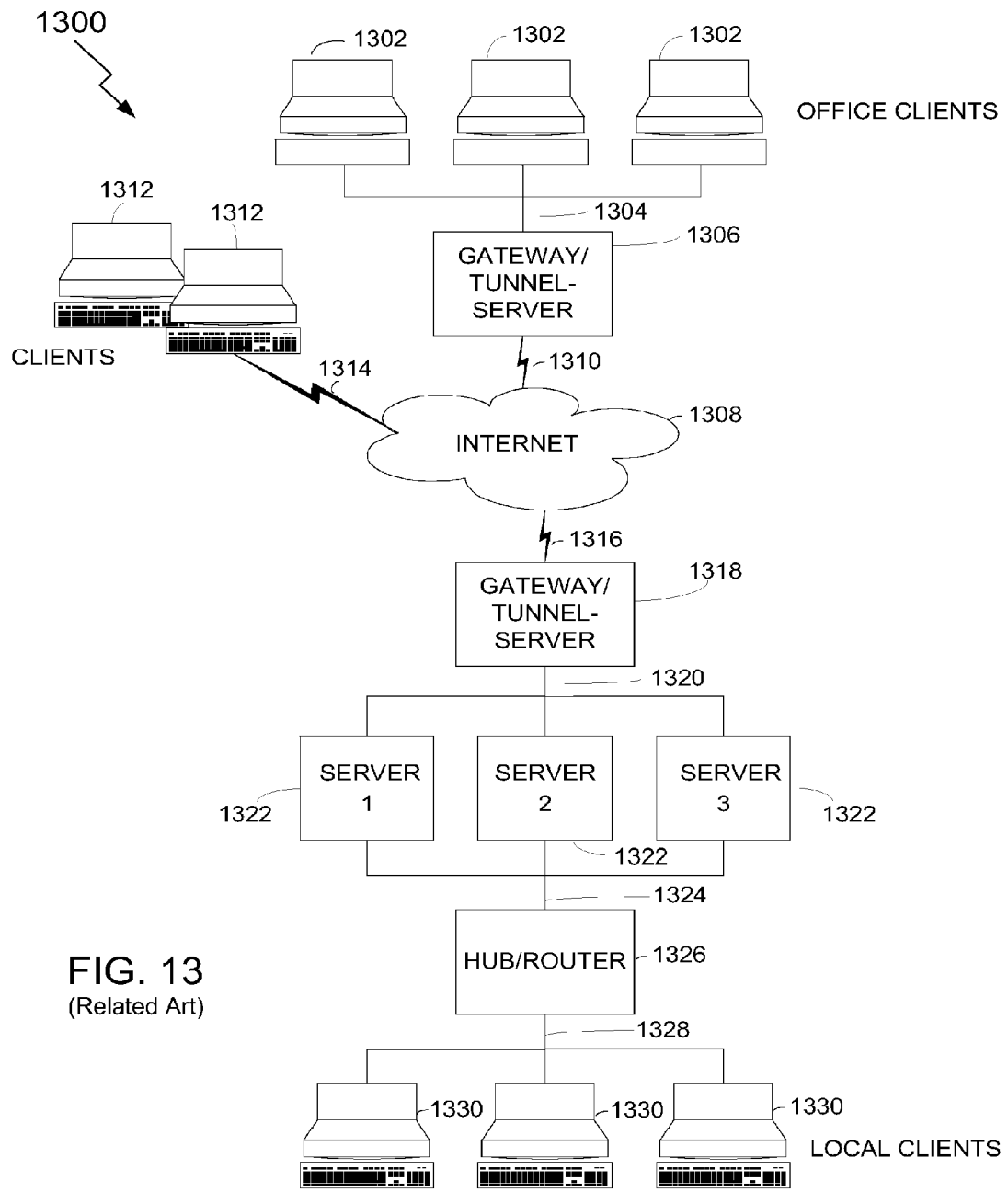
FIG. 13 shows a conventional Internet network configuration.

FIG. 13 shows a conventional Internet network configuration 1300, where a number of office client machines 1302, possibly in a branch office of an enterprise, are shown connected 1304 to a gateway/tunnel-server 1306 which is itself connected to the Internet 1308 via some internet service provider (ISP) connection 1310. Also shown are other possible clients 1312 similarly connected to the Internet 1308 via an ISP connection 1314. An additional client configuration is shown for local clients 1330 (e.g., in a home office). An ISP connection 1316 connects the Internet 1308 to a gateway/tunnel-server 1318 that is connected 1320 to various enterprise application servers 1322. These servers 1322 are connected 1324 to a hub/router 1326 that is connected 1328 to various local clients 1330.

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A method of providing inherited connections in circuits, comprising:

specifying a hierarchical arrangement for a circuit including cell instances and connectors arranged in a tree structure that includes a top-level node at a top end of the hierarchical arrangement, wherein the cell instances include electrical devices, and the connectors include wires and pins;

associating one or more connectivity expressions with the connectors for identifying corresponding signal sources for the connectors, wherein each connectivity expression includes a property name for identifying a signal source and a default value for the signal source;

associating one or more property-setting expressions with the cell instances, wherein each property-setting expression relates a property name to a specified connector and associates a signal source for the property name with a signal source for the specified connector;

using a computer to resolve a first signal source for a first connector associated with a first connectivity expression that includes a first property name and a first default value by following a path in the hierarchical arrangement from the first connector toward the top-level node and using one or more connectivity expressions and property-setting expressions along the path to determine the first signal source; and displaying values from the path to a user including a sequence of one or more property names and corresponding property-setting expressions along the path between the first connector and the first signal source.

2. The method of claim 1, wherein the path is a first path and the method further comprises:

receiving a user input for changing the specified connector of a first property-setting expression along the first path to determine a second path in the hierarchical arrangement from the first connector toward the top-level node;

resolving a second signal source for the first connector by following the second path and using one or more connectivity expressions and property-setting expressions along the second path to determine the second signal source; and displaying values from the second path to a user including a second sequence of one or more property names and corresponding property-setting expressions along the second path between the first connector and the second signal source.

3. The method of claim 2, further comprising:

displaying a selection of values for connectors or corresponding signal sources to the user for changing the specified connector of the first property-setting expression along the first path to determine the second path.

4. The method of claim 1, further comprising:

resolving signal sources for the connectors associated with connectivity expressions by following paths in the hierarchical arrangement from the connectors toward the top-level node and using the one or more connectivity expressions and connectivity-setting expressions along the paths to determine the signal sources;

displaying to the user values for the connectors, corresponding resolved signal sources and corresponding property-setting expressions; and receiving a user-input from the displayed values for specifying the first connector.

5. The method of claim 1, wherein following the path includes re-parameterizing the first property name into a second property name, including:

using the first connectivity expression to follow the path from the first connector to a first cell instance that includes a first property-setting expression that relates the first property name to a second connector;

using the first property-setting expression to follow the path from the first cell instance to the second connector, wherein the second connector is associated with a second connectivity expression that includes a second property name and a second default value; and replacing the first connectivity expression for the first connector with the second connectivity expression.

6. The method of claim 1, wherein following the path includes determining the first signal source by using a property-setting result that takes the path to a connector that corresponds to the first signal source, wherein the first signal source provides a top-level signal for the circuit.

7. A non-transitory computer-readable medium that stores a computer program for causing a computer to provide inherited connections in circuits, wherein the computer program includes instructions for:

specifying a hierarchical arrangement for a circuit including cell instances and connectors arranged in a tree structure that includes a top-level node at a top end of the hierarchical arrangement, wherein the cell instances include electrical devices, and the connectors include wires and pins;

associating one or more connectivity expressions with the connectors for identifying corresponding signal sources for the connectors, wherein each connectivity expression includes a property name for identifying a signal source and a default value for the signal source;

associating one or more property-setting expressions with the cell instances, wherein each property-setting expression relates a property name to a specified connector and associates a signal source for the property name with a signal source for the specified connector;

resolving a first signal source for a first connector associated with a first connectivity expression that includes a first property name and a first default value by following a path in the hierarchical arrangement from the first connector toward the top-level node and using one or more connectivity expressions and property-setting expressions along the path to determine the first signal source; and displaying values from the path to a user including a sequence of one or more property names and corresponding property-setting expressions along the path between the first connector and the first signal source.

8. The non-transitory computer-readable medium of claim 7, wherein the path is a first path and the computer program further includes instructions for:

receiving a user input for changing the specified connector of a first property-setting expression along the first path to determine a second path in the hierarchical arrangement from the first connector toward the top-level node;

resolving a second signal source for the first connector by following the second path and using one or more connectivity expressions and property-setting expressions along the second path to determine the second signal source; and displaying values from the second path to a user including a second sequence of one or more property names and corresponding property-setting expressions along the second path between the first connector and the second signal source.

9. The non-transitory computer-readable medium of claim 8, wherein the computer program further includes instructions for:

displaying a selection of values for connectors or corresponding signal sources to the user for changing the specified connector of the first property-setting expression along the first path to determine the second path.

10. The non-transitory computer-readable medium of claim 7, wherein the computer program further includes instructions for:

resolving signal sources for the connectors associated with connectivity expressions by following paths in the hierarchical arrangement from the connectors toward the top-level node and using the one or more connectivity expressions and connectivity-setting expressions along the paths to determine the signal sources;

displaying to the user values for the connectors, corresponding resolved signal sources and corresponding property-setting expressions; and receiving a user-input from the displayed values for specifying the first connector.

11. The non-transitory computer-readable medium of claim 7, wherein following the path includes re-parameterizing the first property name into a second property name, including:

using the first connectivity expression to follow the path from the first connector to a first cell instance that includes a first property-setting expression that relates the first property name to a second connector;

using the first property-setting expression to follow the path from the first cell instance to the second connector, wherein the second connector is associated with a second connectivity expression that includes a second property name and a second default value; and replacing the first connectivity expression for the first connector with the second connectivity expression.

12. The non-transitory computer-readable medium of claim 7, wherein following the path includes determining the first signal source by using a property-setting result that takes the path to a connector that corresponds to the first signal source, wherein the first signal source provides a top-level signal for the circuit.

13. An apparatus for providing inherited connections in circuits, the apparatus comprising a computer for executing computer instructions, wherein the computer includes computer instructions for:
  specifying a hierarchical arrangement for a circuit including cell instances and connectors arranged in a tree structure that includes a top-level node at a top end of the hierarchical arrangement, wherein the cell instances include electrical devices, and the connectors include wires and pins;
  associating one or more connectivity expressions with the connectors for identifying corresponding signal sources for the connectors, wherein each connectivity expression includes a property name for identifying a signal source and a default value for the signal source;
  associating one or more property-setting expressions with the cell instances, wherein each property-setting expression relates a property name to a specified connector and associates a signal source for the property name with a signal source for the specified connector;
  resolving a first signal source for a first connector associated with a first connectivity expression that includes a first property name and a first default value by following a path in the hierarchical arrangement from the first connector toward the top-level node and using one or more connectivity expressions and property-setting expressions along the path to determine the first signal source; and
  displaying values from the path to a user including a sequence of one or more property names and corresponding property-setting expressions along the path between the first connector and the first signal source.

14. The apparatus of claim 13, wherein the path is a first path and the computer further includes computer instructions for:
  receiving a user input for changing the specified connector of a first property-setting expression along the first path to determine a second path in the hierarchical arrangement from the first connector toward the top-level node;
  resolving a second signal source for the first connector by following the second path and using one or more connectivity expressions and property-setting expressions along the second path to determine the second signal source; and
  displaying values from the second path to a user including a second sequence of one or more property names and corresponding property-setting expressions along the second path between the first connector and the second signal source.

15. The apparatus of claim 14, wherein the computer further includes computer instructions for:
  displaying a selection of values for connectors or corresponding signal sources to the user for changing the specified connector of the first property-setting expression along the first path to determine the second path.

16. The apparatus of claim 13, wherein the computer further includes computer instructions for:
  resolving signal sources for the connectors associated with connectivity expressions by following paths in the hierarchical arrangement from the connectors toward the top-level node and using the one or more connectivity expressions and connectivity-setting expressions along the paths to determine the signal sources;
  displaying to the user values for the connectors, corresponding resolved signal sources and corresponding property-setting expressions; and
  receiving a user-input from the displayed values for specifying the first connector.

17. The apparatus of claim 13, wherein following the path includes re-parameterizing the first property name into a second property name, including:
  using the first connectivity expression to follow the path from the first connector to a first cell instance that includes a first property-setting expression that relates the first property name to a second connector;
  using the first property-setting expression to follow the path from the first cell instance to the second connector, wherein the second connector is associated with a second connectivity expression that includes a second property name and a second default value; and
  replacing the first connectivity expression for the first connector with the second connectivity expression.

18. The apparatus of claim 13, wherein following the path includes determining the first signal source by using a property-setting result that takes the path to a connector that corresponds to the first signal source, wherein the first signal source provides a top-level signal for the circuit.

19. The apparatus of claim 13, wherein the computer includes a processor with memory for executing at least some of the computer instructions.

20. The apparatus of claim 13, wherein the computer includes circuitry for executing at least some of the computer instructions.

* * * * *

UNITED STATES PATENT AND TRADEMARK OFFICE
CERTIFICATE OF CORRECTION

PATENT NO. : 8,214,791 B1
APPLICATION NO. : 12/561999
DATED : July 3, 2012
INVENTOR(S) : Donald J. O'Riordan Page 1 of 1

It is certified that error appears in the above-identified patent and that said Letters Patent is hereby corrected as shown below:

In column 2, line 45, after "FIG 10", delete "shows an", therefor

In column 2, line 66, delete "or-gate", and insert --OR gate--, therefor

In column 3, line 48, delete "it", and insert --i1--, therefor

In column 3, line 50, after "cells", insert --.--, therefor

In column 5, line 36, after "expression", insert --.--, therefor

In column 6, line 35, after "third", insert --,--, therefor

In column 7, line 6, delete "powr", and insert --power--, therefor

In column 9, line 59, after "Depending", delete "on the", therefor

Signed and Sealed this
Fourth Day of December, 2012

David J. Kappos
*Director of the United States Patent and Trademark Office*